United States Patent
Park et al.

(10) Patent No.: US 7,514,354 B2
(45) Date of Patent: Apr. 7, 2009

(54) METHODS FOR FORMING DAMASCENE WIRING STRUCTURES HAVING LINE AND PLUG CONDUCTORS FORMED FROM DIFFERENT MATERIALS

(75) Inventors: Ki-Chul Park, Fishkhill, NY (US); Ja-Hum Ku, LaGrangeville, NY (US); Seung-Man Choi, Fishkhill, NY (US)

(73) Assignee: Samsung Electronics Co., Ltd, Suwon-Si (KR)

( * ) Notice: Subject to any disclaimer, the term of this patent is extended or adjusted under 35 U.S.C. 154(b) by 98 days.

(21) Appl. No.: 11/323,328

(22) Filed: Dec. 30, 2005

(65) Prior Publication Data

US 2007/0155165 A1 Jul. 5, 2007

(51) Int. Cl.
*H01L 21/4763* (2006.01)

(52) U.S. Cl. .............................. 438/629; 257/E21.579; 438/625; 438/648; 438/652

(58) Field of Classification Search .................. 438/627, 438/675, 637, 625, 629, 648, 652; 257/E21.579
See application file for complete search history.

(56) References Cited

U.S. PATENT DOCUMENTS

| | | | | |
|---|---|---|---|---|
| 5,567,650 A | * | 10/1996 | Straight et al. | 438/640 |
| 5,897,369 A | * | 4/1999 | Jun | 438/629 |
| 6,537,913 B2 | * | 3/2003 | Modak | 438/687 |
| 6,787,460 B2 | | 9/2004 | Lee et al. | |
| 6,808,976 B1 | * | 10/2004 | Agarwal | 438/238 |
| 7,125,793 B2 | * | 10/2006 | Liou et al. | 438/637 |
| 7,268,073 B2 | * | 9/2007 | Ramappa et al. | 438/652 |
| 2002/0061645 A1 | | 5/2002 | Trivedi et al. | |
| 2003/0116858 A1 | * | 6/2003 | Trivedi et al. | 257/774 |
| 2003/0134510 A1 | * | 7/2003 | Lee et al. | 438/674 |
| 2003/0232496 A1 | * | 12/2003 | Koo | 438/626 |
| 2004/0127023 A1 | * | 7/2004 | Chun | 438/653 |
| 2005/0250311 A1 | * | 11/2005 | Miyajima et al. | 438/623 |
| 2005/0272257 A1 | * | 12/2005 | Fuchs et al. | 438/643 |
| 2007/0114671 A1 | * | 5/2007 | Hsu et al. | 257/774 |

FOREIGN PATENT DOCUMENTS

| | | |
|---|---|---|
| JP | 2005-057277 | 3/2005 |
| KR | 100215846 | 5/1999 |
| KR | 1020030073614 | 9/2003 |

* cited by examiner

*Primary Examiner*—Asok K Sarkar
(74) *Attorney, Agent, or Firm*—F. Chau & Associates, LLC

(57) ABSTRACT

Methods are provided for forming dual damascene interconnect structures using different conductor materials to fill via holes and line trenches. For example, a method for forming an interconnection structure includes depositing dielectric material on a semiconductor substrate and etching the dielectric material to form a dual damascene recess structure including a via hole and trench. A layer of first conductive material is then conformally deposited to fill the via hole with the first conductive material, and the layer of first conductive material is etched to remove the first conductive material from the trench and an upper region of the via hole below the trench. A layer of second conductive material is then deposited to fill the trench and upper region of the via hole with the second conductive material.

21 Claims, 4 Drawing Sheets ant_with the top surface of the ILD layer (13).
METHODS FOR FORMING DAMASCENE WIRING STRUCTURES HAVING LINE AND PLUG CONDUCTORS FORMED FROM DIFFERENT MATERIALS

TECHNICAL FIELD OF THE INVENTION

The present invention relates generally to methods for fabricating metal wiring layers of a semiconductor device and, in particular, to methods for forming dual damascene interconnect structures using different conductor materials to fill via holes and line trenches.

BACKGROUND

Due to continuing technological innovations in the field of semiconductor fabrication, IC (integrated circuit) manufactures are developing ICs with larger scale of integration, higher device density, lower power consumption and higher operating speeds. Typically, highly integrated circuits are designed using multi-level interconnection structures that include intra-level interconnects (metal lines/wiring) and inter-level interconnects (plugs/contacts) embedded in interlayer dielectric (ILD) material, which are formed from different metal layers as part of a BEOL (back end of line) metallization process. Contact plugs are also formed to connect active devices in a silicon wafer to a first level of metallization.

Various methods have been developed to form interconnection structures. For instance, FIG. 1 schematically illustrates a conventional interconnection structure. More specifically, FIG. 1 schematically illustrates a semiconductor device (10) having a conventional bi-metal interconnection structure in which different conductive materials are used to form contact plugs and metal lines. Referring to FIG. 1, the semiconductor device (10) comprises a semiconductor substrate (11) having an active device (12) formed thereon. The active device (12) (e.g., MOS transistor) comprises a polysilicon gate structure (12a) and source/drain diffusion regions (12b, 12c).

A plurality of ILD (interlayer dielectric) layers (13), (14) and (15) are formed over the substrate (11). A first ILD layer (13) is formed to cover the active device (12). A plurality of plugs (16) are formed in the ILD layer (13) to provide contacts between gate (12a) and source/drain regions (12b, 12c) and respective metal wiring/pads (17) (i.e., metallization level M1) that are embedded in the second ILD layer (14). A plurality of plugs (18) are formed in the ILD layer (14) to provide contacts between the metal wiring/pads (17) and respective metal wiring/pads (19) (i.e., metallization level M2) that are embedded in the third ILD layer (15). A plurality of plugs (20) are formed in the ILD layer (15) to provide contacts between the metal wiring/pads (19) and wiring/pads of a next metallization level.

In the conventional embodiment of FIG. 1, the plugs (16, 18, 20) and metal wiring/pads (17, 19) are formed from different conductive materials. For instance, a refractory metal such as tungsten (W) is typically used to form the contact plugs. The metal wiring/pads (17) and (19) can be formed using aluminum or copper or alloys thereof. Different methods may be used to construct interconnect structures depending on the wiring material.

For example, a subtractive metal etch process is commonly used when the metal wiring/pads are formed using Al, for example. With such method, the interconnect structure of FIG. 1 could be formed as follows. The ILD layer (13) (e.g., silicon dioxide) is deposited and a photolithographic process is performed to form via hole openings in the ILD layer (13). A liner/barrier material is deposited to line the via holes and a layer of tungsten is deposited to fill the via holes. Excess tungsten material is removed by chemical mechanical polishing (CMP) to make the top surface of the plugs (16) coplanar with the top surface of the ILD layer (13).

The metallization layer M1 is then formed by depositing and etching a layer of Al using well-known techniques to form the wiring/pad pattern. After M1 is formed, a layer of dielectric material is deposited and planarized to form the second ILD layer (14). Thereafter, the contact plugs (18) of the second ILD layer (14) are formed using a photolithographic process to form via hole openings in the ILD layer (14) down to respective wires/pads (17), depositing a liner/barrier material and a layer of tungsten to fill the via holes, and then removing excess tungsten material by chemical mechanical polishing (CMP) to make the top surface of the plugs (18) coplanar with the top surface of the ILD layer (14). The second level metallization M2 wires/pads (19), ILD layer (15) and plugs (20) (as well as upper layers) are formed by repeating this process.

On the other hand, when copper Cu is used to form the wiring/pads (17) and (19), a subtractive etch process is not typically used because copper is difficult to pattern using a conventional photolithography/etching techniques, especially when the copper wires are formed according to relatively small design rules. Instead, the interconnect structure of FIG. 1 can be formed using a conventional single damascene process, as follows. The ILD layer (13) (e.g., silicon dioxide) is deposited and a photolithographic process is performed to form via hole openings in the ILD layer (13). A liner/barrier material is deposited to line the via holes and a layer of tungsten is deposited to fill the via holes. Excess tungsten material is removed by chemical mechanical polishing (CMP) to make the top surface of the plugs (16) coplanar with the top surface of the ILD layer (13). Next, a dielectric layer is deposited and trench openings are formed in the dielectric layer aligned to the plugs (16).

A liner (or diffusion barrier) material is deposited to line the trenches and a layer of copper is deposited to fill the trenches using known techniques (e.g., electroplating). Typically, Ti/TiN is utilized as the liner material for tungsten and Ta/TaN is utilized as the liner material for copper. Thereafter, excess copper material is removed by chemical mechanical polishing (CMP) to make the top surface of the metal wires/pads (17) coplanar with the top surface of the dielectric layer.

Next, a capping layer (such as SiN or SiCN) and a second dielectric layer are sequentially deposited over the planarized dielectric layer including wires/pads (17). A capping layer is typically deposited before the second dielectric layer to thereby protect the copper material from oxidation during deposition of the second dielectric layer. Via openings are then formed in the second dielectric layer down to the wires/pads (17). Next, a liner material is deposited to line the via holes and a layer of tungsten is deposited to fill the via holes. Excess tungsten material is removed by chemical mechanical polishing (CMP) to make the top surface of the plugs (18) coplanar with the top surface of the second dielectric layer. With this method, the ILD layer (14) is formed by two separate layers of dielectric (via-level and line-level). The above process is repeated for each subsequent metal-plug level.

With each of the conventional methods discussed above, a CMP process is performed after deposition of the plug material (tungsten) to remove the excess material and planarize the surface of ILD layers and plugs. In general, CMP has proven to be problematic in this regard, causing interconnect defects and anomalies that reduce final chip yield. For example, CMP can result in what is known as "dishing" due to variation in hardness of materials being chemically/mechanically polished. For instance, oxide material that is used to form the ILD layers is harder than copper or aluminum. Consequently, CMP can cause dishing metal interconnects, which can thin the wire or pad and result in higher-resistance wires or lower-reliability bond pads.

Moreover, CMP can result in what is known as "erosion", where the conductive material and ILD are both removed at a faster rate in one area of the wafer than at other areas. Erosion typically occurs in dense pattern areas of the wafer. For instance, FIG. 2 schematically illustrates erosion resulting from CMP. FIG. 2 illustrates an ILD layer (25) having a dense pattern of plugs (26). In FIG. 2, erosion results in a sub-planar dipping surface (25b) below the surrounding planar surface regions (25a). The erosion can cause short circuits between adjacent wires on the next layer.

FIG. 3 schematically illustrates another conventional interconnection structure. More specifically, FIG. 3 schematically illustrates a semiconductor device (30) having a conventional interconnection structure which is formed, in part, using a "dual damascene" process, which eliminates a CMP step after plug metal deposition. Referring to FIG. 3, the semiconductor device (30) comprises a semiconductor substrate (31) having an active device (32) formed thereon. The active device (32) (e.g., MOS transistor) comprises a polysilicon gate structure (32a) and source/drain diffusion regions (32b, 32c). A plurality of ILD (interlayer dielectric) layers (33), (34) and (35) are formed over the substrate (31). A first ILD layer (33) is formed to cover the active device (32). A plurality of plugs (36) are formed in the ILD layer (33) to provide contacts between gate (32a) and source/drain regions (32b, 32c) and respective metal wiring/pads (37) (i.e., metallization level M1) that are embedded in the second ILD layer (34). Assuming the wiring/pads (37) are formed of copper and the plugs (36) are formed of tungsten, these structures can be formed using conventional methods discussed above with reference to FIG. 1.

The third ILD layer (35) includes a plurality of plugs (38) and respective metal wiring/pads (39) (i.e., metallization level M2) that are formed of copper using a "dual damascene" process. In general, a dual damascene process includes forming a via hole and a trench region in an interlayer dielectric (ILD) layer in alignment with a predetermined region of a lower metal line. The via hole and trench region are then filled with copper material in a single copper deposition process (e.g., electroplating) to integrally form the metal lines (39) and respective contacts (38).

In a dual-damascene (DD) structure, only a single metal deposition step is used to simultaneously form the main metal lines and the metal in the vias. That is, both trenches and vias are formed in a single dielectric layer. In contrast to the methods for forming bi-metal interconnect structures as discussed above with reference to FIG. 1, the dual damascene process forms an integrated wire/plug structure at each level, thereby reducing or otherwise eliminating potential defects that can occur between plugs and metal layers due to erosion from the CMP.

Although dual damascene methods allow formation of metal interconnect structures that yield improved performance, such methods become more problematic with decreasing design rules. For example, as the pitch between interconnection lines is decreased to meet smaller design rule requirements, the critical dimensions of the metal wiring become more narrow and the aspect ratio of the contact holes for electrically connecting upper and lower metal wiring is increased. It is difficult to sufficiently fill high aspect ratio holes and vias with copper using current technology. Moreover, the use of copper to form contacts between the active semiconductor devices and the first level metallization M1 is problematic with regard to copper diffusion into the silicon.

SUMMARY OF THE INVENTION

Exemplary embodiments of the invention generally include methods for forming dual damascene interconnect structures using different conductor materials to fill via holes and line trenches, which eliminate the problems associated with conventional methods discussed above.

In one exemplary embodiment of the invention, a method for forming an interconnection structure comprises depositing dielectric material on a semiconductor substrate and etching the dielectric material to form a dual damascene recess structure comprising a via hole and trench. A layer of first conductive material is then conformally deposited to fill the via hole with the first conductive material, and the layer of first conductive material is etched to remove the first conductive material from the trench and an upper region of the via hole below the trench. A layer of second conductive material is then deposited to fill the trench and upper region of the via hole with the second conductive material.

In another exemplary embodiment of the invention, a method for forming a bi-metal interconnection structure comprises depositing dielectric material on a semiconductor substrate and etching the dielectric material to form a dual damascene recess structure comprising a via hole and trench. A layer of tungsten is then conformally deposited to fill the via hole with tungsten material and the tungsten layer is isotropically etched to remove the tungsten material from the trench and an upper region of the via hole below the trench. The trench and upper region of the via hole are then filled with copper to form bi-metal interconnect.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
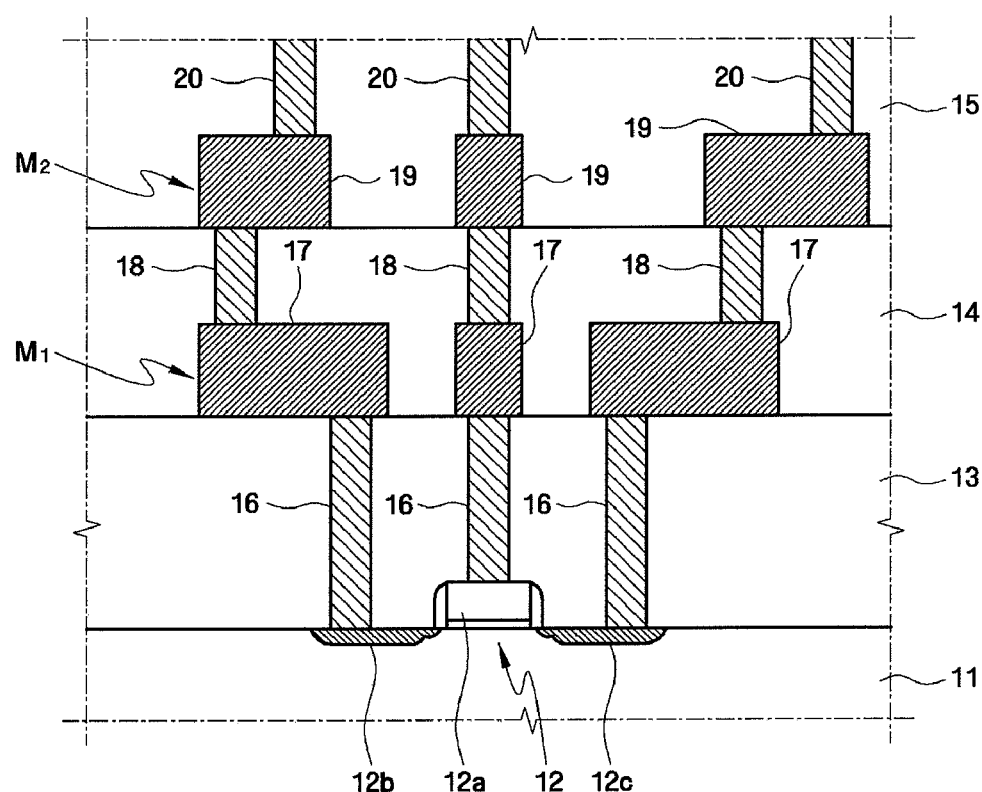
FIG. 1 schematically illustrates a conventional interconnect structure having bi-metal interconnects.
Figure 2:
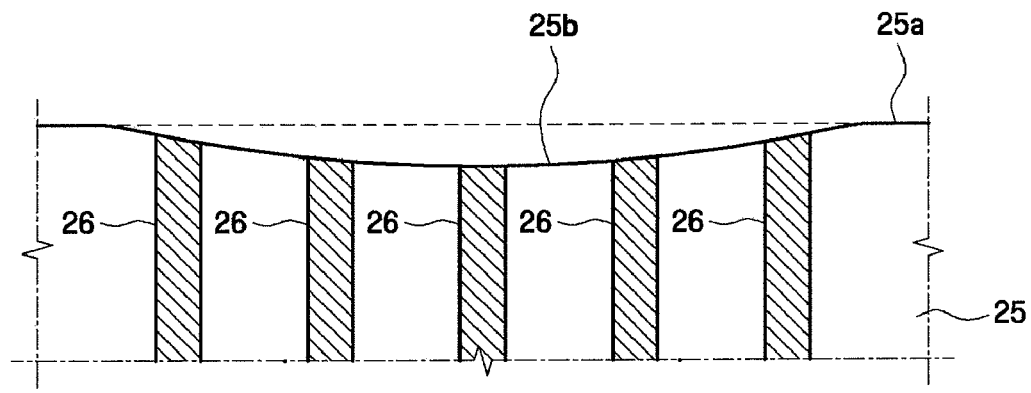
FIG. 2 schematically illustrates an erosion defect that can result from CMP.
Figure 3:
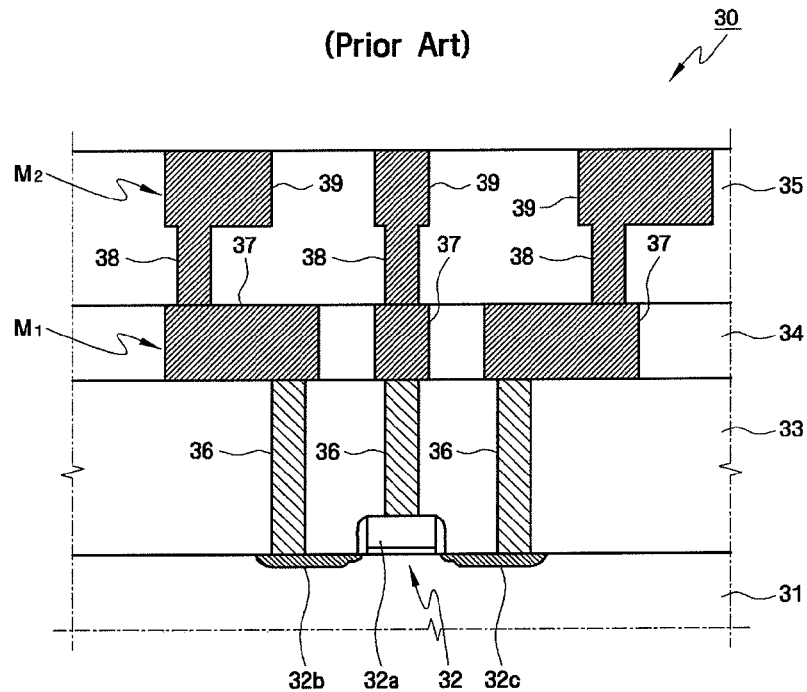
FIG. 3 schematically illustrates a conventional interconnect structure having copper interconnects formed using a dual damascene process.

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 4A:
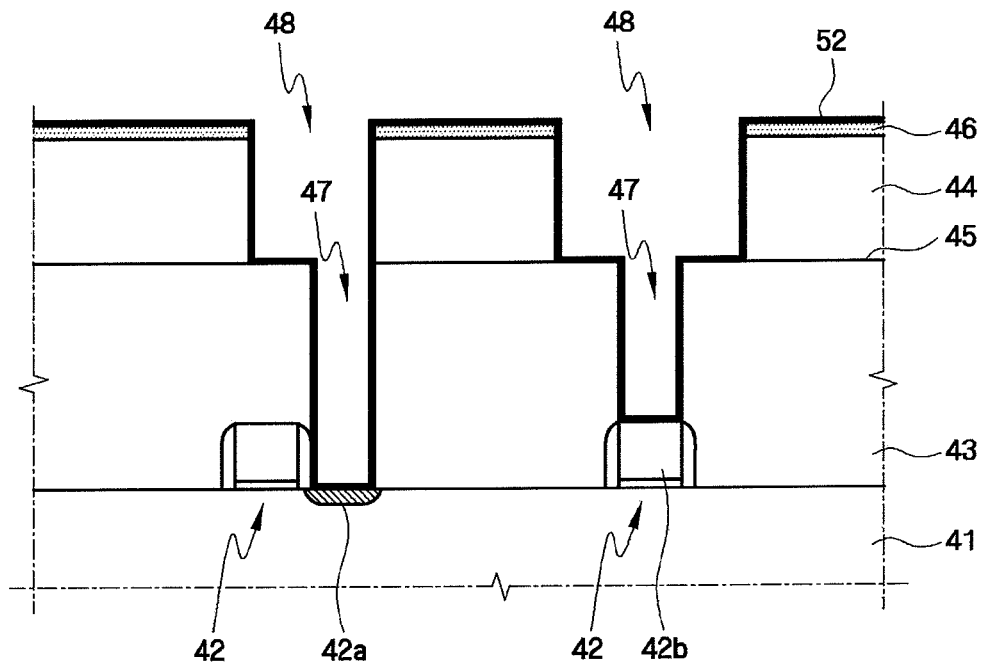
FIGS. 4A~4E are cross-sectional views illustrating methods for forming a metal wiring layer of a semiconductor device according to exemplary embodiments of the invention.
Figure 4B:
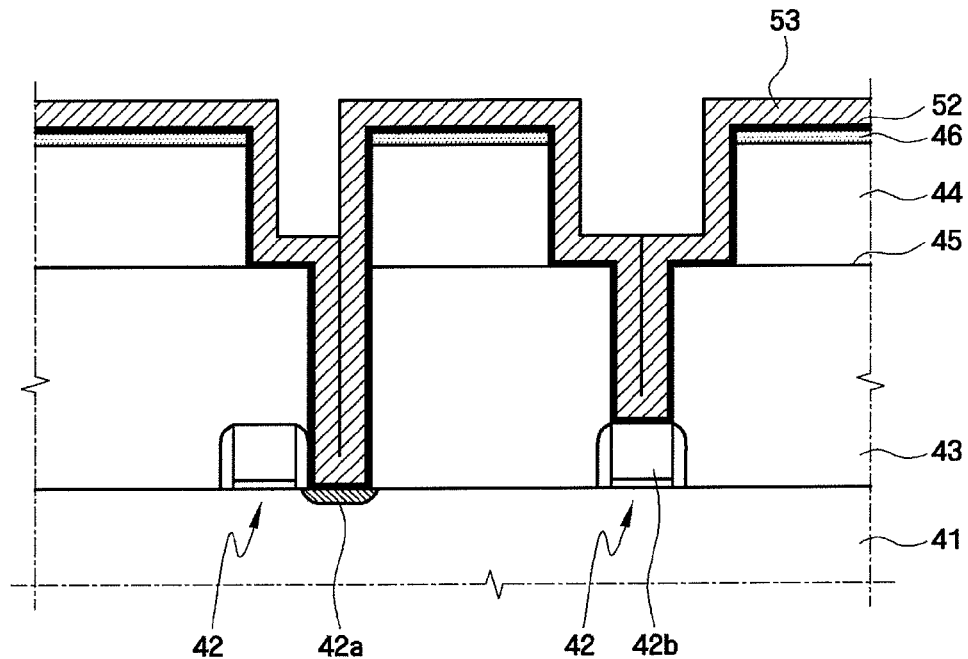
Figure 4C:
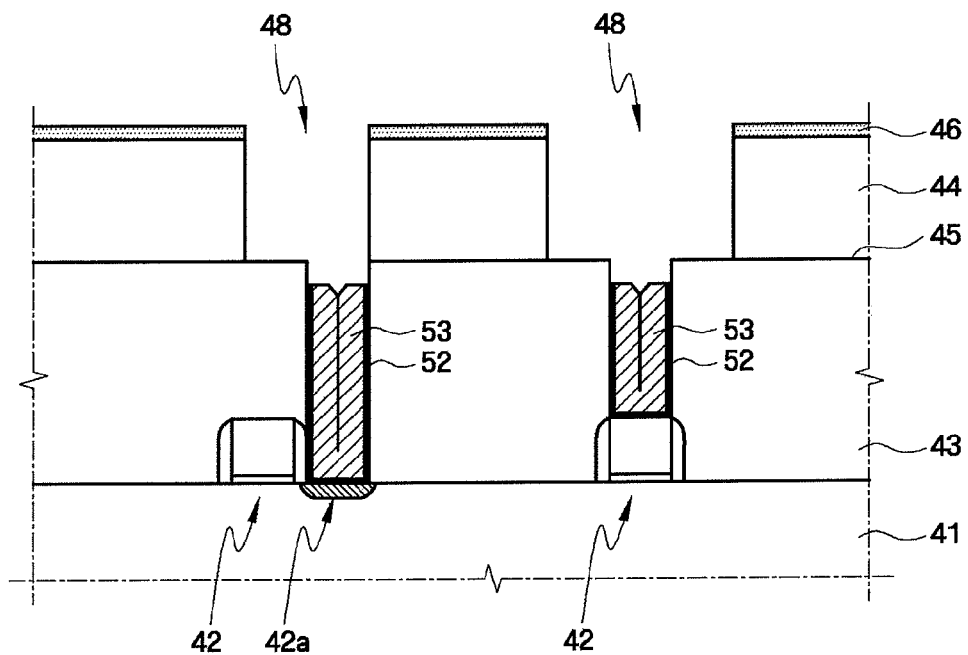
Figure 4D:
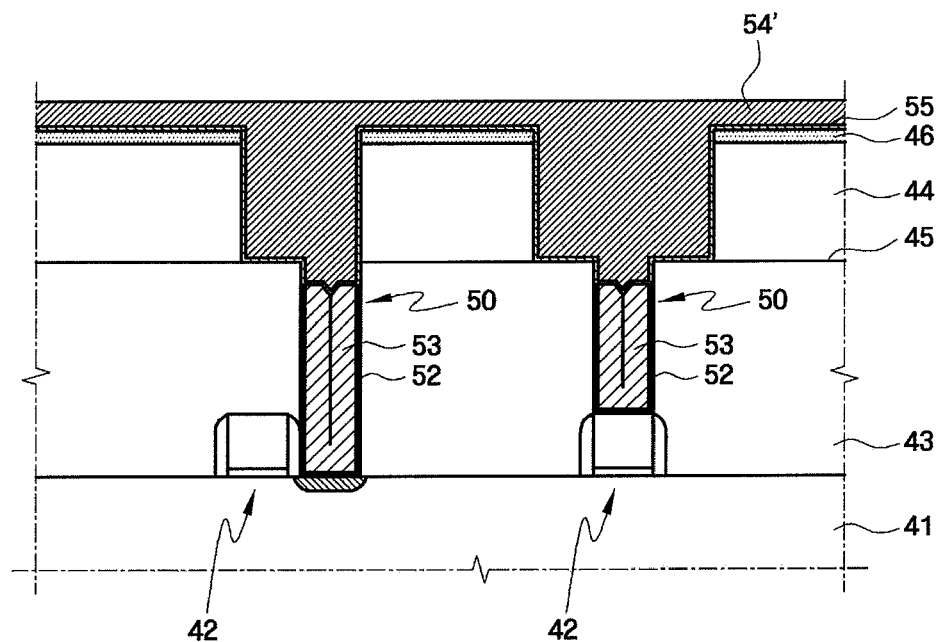
Figure 4E:
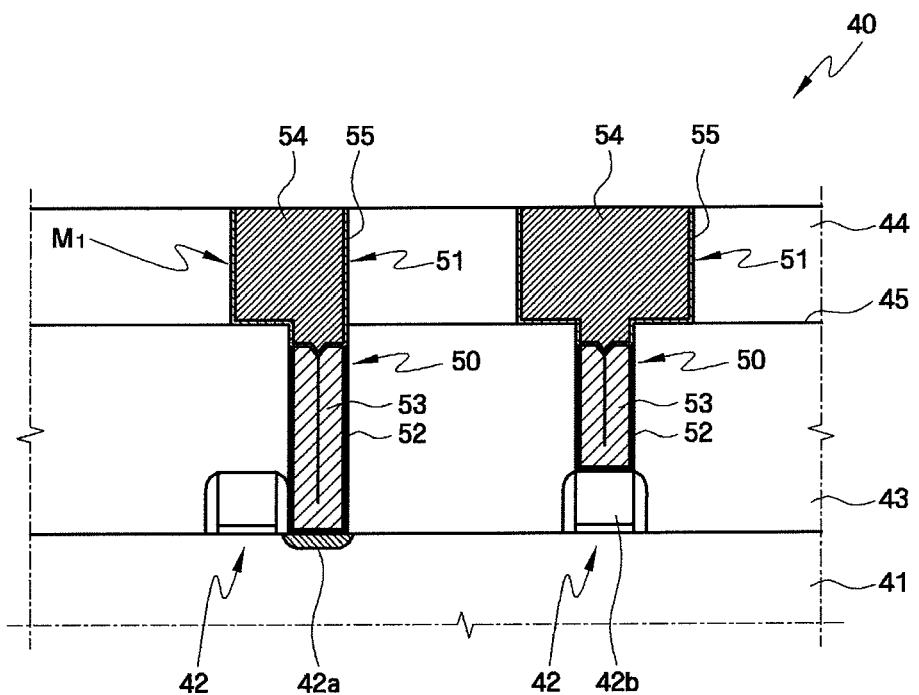

FIGS. 4A–4E are schematic cross-sectional views illustrating a method for forming metal wiring layers of a semiconductor device according to an exemplary embodiment of the present invention. FIG. 4E schematically illustrates a semiconductor device (40) having an interconnect structure that is formed to a first level of metallization M1 according to an exemplary embodiment of the invention. The semiconductor device (40) is depicted having a semiconductor substrate (41) with a plurality of active devices (42) formed thereon. A plurality of ILD (interlayer dielectric) layers (43) and (44) are formed over the substrate (41). An etch stop/barrier layer (45) is formed between the ILD layers (43) and (44). The first ILD layer (43) is formed to cover the active devices (42). A plurality of plugs (50) are formed in the ILD layer (43). A plurality of metal lines (51) (metallization level M1) are formed in the second ILD layer (44). The plugs (50) provide contacts between a gate (42b) and source/drain region (42a) to respective metal lines (51).

In general, the interconnect structure depicted in FIG. 4E is formed by patterning dual damascene recess structures (i.e., forming trenches and corresponding via holes) in the ILD layers (43) and (44) and then forming the plug/line conductors (50/51) using separate metal deposition methods to fill the via holes and trenches while eliminating a CMP step between the separate metal depositions. Exemplary methods for forming the device (40) of FIG. 4E will be explained in further detail with initial reference to FIG. 4A. FIG. 4A is a schematic cross-sectional view illustrating an intermediate interconnect structure in which dual damascene recess structures including via holes (47) and trenches (48) are formed in dielectric material deposited over the substrate (41).

In the exemplary embodiment of FIG. 4A, the dielectric material in which the trenches and vias are etched comprises three layers of dielectric material, including a first layer of dielectric material (e.g., SiO2) to form the ILD layer (43) in which the vias (47) are etched, a second layer of dielectric material (e.g., silicon nitride) to form a thin, embedded etch stop/barrier layer (45), and a third layer of dielectric material (e.g., a low-k dielectric layer) to form the ILD layer (44) in which the trenches (48) are etched. In other exemplary embodiments of the invention, the dielectric material for each level of the interconnection structure may be formed of a single layer of dielectric material.

The etch stop/barrier layer (45) is an optional layer that may be included to provide an etch stop layer when etching the trenches (48) in the ILD layer (44). The etch stop/barrier layer (45) acts as a diffusion barrier layer to prevent/reduce diffusion of the metallic material (which is used to fill trenches (48)) into the ILD layer (43). The etch stop layer (45) is made as thin as possible to maintain an overall low dielectric characteristic of the dielectric stack, while providing a sufficient diffusion barrier. In one exemplary embodiment, the etch stop layer (45) is formed of an insulating material having a thickness of about 300 to about 500 angstroms, and having a high etching selectivity with respect to the ILD layers (43) and (44). For example, the etch stop layer (45) may be formed of SiC, SiN, SiCN, SiCO or SiCON, for example, and formed using known techniques.

In one exemplary embodiment, the ILD layer (43) may be formed with an oxide material such as silicon dioxide. In one exemplary embodiment, the ILD layer (44) is formed of a low-k dielectric material. For example, the ILD layer (44) may be formed of a silicon oxide layer doped with carbon, fluorine or hydrogen atoms, e.g., a silicon oxycarbide (SiOC) layer, a SiOCH layer, a fluoro-silses-quioxane layer (FSQ) layer, a hydro-silses-quioxane (HSQ) layer or a methyl-silses-quioxane (MSQ) layer. The ILD layers (43) and (44) are preferably formed of materials having a high etching selectivity with respect to the etch stop layer (45).

The capping layer (46) (or hard mask layer) may be formed to protect the ILD layer (44) from being damaged during plasma processes and to act as a buffer layer for a subsequent CMP process. The capping layer (46) is formed with a material having a high etching selectivity with respect to the ILD layers (43) and (44). For example, the hard mask layer (46) may be formed of: (i) an insulating nitride layer, such as a silicon nitride layer (SiN), a silicon carbonitride layer (SiCN) or a boron nitride layer (BN); (ii) an insulating carbide layer, such as a silicon carbide layer (SiC); (iii) a metal nitride layer, such as a tantalum nitride (TaN) layer, a titanium nitride (TiN) layer, a tungsten nitride (WN) layer or an aluminum nitride (AlN) layer; (iv) a metal oxide layer, such as an aluminum oxide ($AL_2O_3$) layer, a tantalum oxide (TaO) layer or a titanium oxide (TiO) layer; or (v) a silicon layer such SiO2, or other materials such as SiOF and SiON, for example.

After the dielectric layer(s) (e.g., 43, 45, 44) and the capping layer (46) are formed, the via holes (47) and corresponding trenches (48) are etched into the dielectric layer(s) to form dual damascene recess structures. The via holes (47) and trenches (48) are formed using well-known techniques, such as photolithography and dry-etching techniques, to etch openings in the dielectric and capping layers. Further, the dual damascene recess structures (47/48) may be formed using known methods such as VFDD (via first dual damascene) or TFDD (trench first dual damascene) techniques. The ILD layers (44) and (43) can be etched using conventional anisotropic dry oxide etch methods.

After formation of the dual damascene recess structures (47/48), a bi-metal interconnection structures are formed by filling the via holes (47) and trenches (48) with different conductive materials. More specifically, in one embodiment, referring to FIG. 4A, a thin, conformal barrier layer (52) is optionally formed to line the side/bottom walls of the trenches (48) and via holes (47) and on the surface of the capping layer (46). Next, referring to FIG. 4B, a first conductive material (53) is conformally deposited to fill the via holes (47). The first conductive material (53) may be any suitable material for forming via contacts, preferably a refractory metal such as tungsten which is deposited using CVD or PVD. Tungsten has electrical and material characteristics that make it particularly useful for forming contact plugs. For example, tungsten has a relatively high melting point (thermal stability), good conductivity (low resistance) and good step coverage when deposited via CVD (allowing uniform filling of high-aspect ratio via holes). Moreover, tungsten is resistant to electromigration failure and serves as a barrier to diffusion and reaction between silicon and the first metal layer M1.

When tungsten is used to fill via holes, the liner (52) may be formed of a material such as titanium (Ti) or titanium nitride (TiN), for example, which is deposited using CVD or PVD. The barrier layer (52) enhances adhesion and lowers the contact resistance between the tungsten material (53) and the diffusion regions (e.g., 42a). A TiN layer may be deposited, for example, by sputtering prior to tungsten deposition by low pressure CVD, sputtering or electron beam evaporation.

Referring to FIG. 4C, following deposition of the conformal liner (52) and conductive material (53) layers, an etch back process is performed to remove the excess liner and conductor material (52) and (53) on the capping layer (46) and the walls of the trenches (48). In addition, the etch back is applied such that the liner and conductor materials (52) and (53) are recessed below the bottom of the trenches (48). In other words, the etch process is performed to remove the liner and conductor material (52) and (53) from the upper portion of the via holes (47). The conductor layer (53) and liner (52) may be etched back together or separately, for example, using a suitable isotropic dry etch process, wet etch process, or combination dry/wet etch process.

In another exemplary embodiment of the invention, the etch back process can be applied to remove only the first conductive material (53), while leaving the liner layer (52) as a protective layer to protect the dielectric material layers (43) and (44) during the etch back process. Following the etching process, a wet cleaning process could be applied to clean the exposed surfaces of the dielectric material (43), (44) or liner material (52) in the trenches (48) and upper regions of the via holes (47).

Thereafter, referring to FIG. 4D, a second layer of conductive material (54) is deposited to fill the trenches (48) and upper portions of the via holes (47). Optionally, a second thin, conformal liner (55) may be deposited prior to depositing the conductive material (54). The second conformal liner (55) may be deposited over the first liner layer (52) (if the liner (52) is not removed during the etch process). In one exemplary embodiment, the second conductor material (54) may be copper that is deposited using a conventional electroplating process. The second liner (55) may be formed of Ta and/or TaN and conformally deposited using CVD, for example.

Referring to FIG. 4E, a planarization process (e.g., CMP) is then performed to planarize the top surface of the structure down to the capping layer (46) or the ILD layer (44), thus completing formation of a first level interconnection structure comprising level 1 metallization M1 (51) and contacts (50) to the active devices (42). The processing steps of FIGS. 4A~4E can then be repeated for each subsequent level of interconnection, if necessary.

In the exemplary methods described above with reference to FIGS. 4A~4E, the formation of a dual damascene recess structure coupled with a deposition/etch back of the plug material (e.g., tungsten) in the via hole obviates the need for a CMP process prior to deposition of second conductive material to planarize the plugs (50) and ILD layer (43). This is to be contrasted with conventional methods for forming bi-metal interconnects as discussed above with reference to FIG. 1, wherein a CMP of the contact plug material and ILD material can cause dishing and erosion, which may lead to interconnect defects and reduce yield.

Moreover, as compared to conventional dual-damascene methods that use copper to fill the via holes and trenches to form copper plugs and metal wires, the use of a material such as tungsten, which provides good step coverage and which can be readily etched using conventional dry/wet etch processes, allows the via holes of the dual damascene recess structures to be readily filled (with minimal or no voids) and readily removed from the trench regions and upper regions of the via holes. The use of tungsten material to form contact plugs in the lower portion of the via holes provides a diffusion barrier between the copper material of the metal lines and the active silicon regions, while reducing the aspect ratio of the dual-damascene recess structures, thereby allowing the trenches to be sufficiently filled (e.g., no voids) with copper material using conventional methods.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A method for forming an interconnection structure, comprising:
    depositing dielectric material on a semiconductor substrate;
    etching the dielectric material to form a dual damascene recess structure comprising a via hole and trench;
    conformally depositing a layer of first conductive material to fill the via hole with the first conductive material;
    etching the layer of first conductive material to remove the first conductive material from the trench and an upper region of the via hole below the trench; and
    depositing a layer of second conductive material to fill the trench and upper region of the via hole with the second conductive material.

2. The method of claim 1, further comprising removing an excess of the second conductive material by a CMP (chemical mechanical polishing) process.

3. The method of claim 1, wherein depositing dielectric material on a semiconductor substrate comprises forming a plurality of ILD (interlayer dielectric) layers.

4. The method of claim 1, wherein the first conductive material comprises tungsten.

5. The method of claim 1, wherein the second conductive material comprises copper.

6. The method of claim 1, wherein depositing a layer of second conductive material is performed by electroplating.

7. The method of claim 1, further comprising forming a first liner layer on inner surfaces of the trench and via hole before depositing the first conductive material.

8. The method of claim 7, further comprising etching the first liner layer to remove a portion of the first liner layer from the inner surface regions of the trench and the upper region of the via hole below the trench, prior to depositing the second conductive material.

9. The method of claim 8, further comprising forming a second liner layer on inner surfaces of the trench and the upper region of the via before depositing the second conductive material.

10. The method of claim 1, wherein the dielectric material comprises a low-k dielectric material.

11. A method for forming a bi-metal interconnection structure, comprising:
    depositing dielectric material on a semiconductor substrate;
    etching the dielectric material to form a dual damascene recess structure comprising a via hole and trench;
    conformally depositing a layer of tungsten to fill the via hole with tungsten;
    isotropically etching the layer of tungsten to remove tungsten material from the trench and an upper region of the via hole below the trench; and
    filling the trench and upper region of the via hole with copper.

12. The method of claim 11, comprising performing a copper electroplating process to fill the trench and upper region of the via hole with copper.

13. The method of claim 11, comprising performing OMP (chemical mechanical polishing) to remove excess copper material.

14. The method of claim 11, wherein depositing dielectric material on a semiconductor substrate comprises forming first and second ILD (interlayer dielectric) layers.

15. The method of claim 14, comprising forming the via hole in the first ILD layer and forming the trench in the second ILD layer.

16. The method of claim 15, wherein the first ILD layer is an oxide material and wherein the second ILD layer is a low-k dielectric material.

17. The method of claim 11, further comprising forming a first liner layer on inner surfaces of the trench and via hole before depositing the tungsten.

18. The method of claim 17, wherein the first liner layer comprises Ti or TiN or both.

19. The method of claim 17, further comprising etching the first liner layer to remove a portion of the first liner layer from the inner surface regions of the trench and the upper region of the via hole below the trench, prior to depositing copper to fill the trench.

20. The method of claim 19, further comprising forming a second liner layer on inner surfaces of the trench and the upper region of the via hole before depositing the copper.

21. The method of claim 20, wherein the second liner layer comprises Ta or TaN or both.

* * * * *